United States Patent [19]

DeLozanne

[11] Patent Number: 5,004,721

[45] Date of Patent: Apr. 2, 1991

[54] AS-DEPOSITED OXIDE SUPERCONDUCTOR FILMS ON SILICON AND ALUMINUM OXIDE

[75] Inventor: A. L. DeLozanne, Austin, Tex.

[73] Assignees: Board of Regents, The University of Texas System, Austin, Tex.; Motorola, Inc., Schaumburg, Ill.

[21] Appl. No.: 266,546

[22] Filed: Nov. 3, 1988

[51] Int. Cl.$^5$ .................... B05D 5/12; B05D 3/06; C23C 14/08
[52] U.S. Cl. .................... 505/1; 505/732; 505/730; 427/62; 427/63; 427/39; 427/38; 427/126.3; 427/255.3; 427/314; 118/726; 118/50
[58] Field of Search .................... 427/39, 38, 62, 63, 427/126.3, 255.3, 314, 126.2, 255.2; 118/715, 726, 50; 505/1, 732, 730

[56] References Cited

U.S. PATENT DOCUMENTS 4,268,711  5/1981  Gurev .................... 136/256
4,385,083  5/1983  Shelley .................... 118/50

FOREIGN PATENT DOCUMENTS 0158479  10/1985  European Pat. Off. .
61-32417  2/1986  Japan .

OTHER PUBLICATIONS

Silver et al., "As-Deposited Superconducting Y-Ba-Cu-O Thin Films on Si, Al$_2$O$_3$ and SrTiO$_3$ Substrates" Appl. Phys. Lett. 52(25), Jun. 1988, pp. 2174-2176.
Spah et al., "Parameters for Insitu Growth of High Tc Superconducting Thin Films Using an Oxygen Plasma Source" Appl. Phys. Lett. 53(5), Aug. 1988, pp. 441-442.
P. Chaudhari, R. H. Koch, R. B. Laibowitz, T. R. McGuire, and R. J. Gambino, "Critical-Current Measurements in Epitaxial Films of YBa$_2$Cu$_3$O$_{7-x}$ Compound", Phys. Rev. Lett., 58, 2684 (1987).
B. Oh, M. Naito, S. Arnason, P. Rosenthal, R. Barton, M. R. Beasley, T. H. Geballe, R. H. Hammond, and A. Kapitulnik, "Critical Current Densities and Transport in Superconducting YBa$_2$Cu$_3$O$_{7-\delta}$ Films Made by Electron Beam Coevaporation", Appl. Phys. Lett. 51, 852 (1987).
D. K. Lathrop, S. E. Russek, and R. A. Buhrmann, "Production of YBa$_2$Cu$_3$O$_{7-y}$ Superconducting Thin Films in Situ by High-Pressure Reactive Evaporation and Rapid Thermal Annealing", Appl. Phys. Lett. 51, 1554 (1987).
T. Terashima, K. Iijima, K. Yamamoto, Y. Bando, and H. Mazaki, "Single-Crystal YBa$_2$Cu$_3$O$_{7-x}$ Thin Films by Activated Reactive Evaporation", Jpn. J. Appl. Phys. 27 L91 (1988).
B-Y. Tsaur, M. S. DiIorio, and A. J. Strauss, "Preparation of Superconducting YBa$_2$Cu$_3$O$_x$ Thin Films by Oxygen Annealing of Multilayer Metal Films", Appl. Phys. Lett. 51, 858 (1987).
Y. Enomoto, T. Murakami, M. Suzuki, and K. Moriwaki, "Largely Anisotropic Superconducting Critical Current in Epitaxially Grown Ba$_2$YCu$_3$O$_{7-y}$ Thin Film", Jpn. J. Appl. Phys. 26, L1248 (1987).

(List continued on next page.)

Primary Examiner—Norman Morgenstern
Assistant Examiner—Roy V. King
Attorney, Agent, or Firm—Arnold, White & Durkee

[57] ABSTRACT

The present invention relates to an electron beam coevaporation method of preparing an oxide superconducting film on a silicon or an aluminum oxide substrate at a temperature below 600° C. without the need for post-annealing, which comprises evaporating metallic superconductor precursor components onto a heated substrate from individual evaporation sources while directing oxygen plasma over the substrate surface wherein the evaporation sources and the substrate are located in two different vacuum chambers, a differential pressure is maintained between the two vacuum chambers during deposition so that the lowest pressure is at the evaporation sources, an intermediate pressure in the vacuum chamber surrounding the substrate and the highest pressure at the substrate surface.

12 Claims, 2 Drawing Sheets

OTHER PUBLICATIONS

M. Hong, S. H. Liou, J. Kwo, and B. A. Davidson, "Superconducting Y-Ba-Cu-O Oxide Films by Sputtering", Appl. Phys. Lett. 51, 694 (1987).

R. M. Silver, J. Talvacchio, and A. L. de Lozanne, "Sputter Deposition of $YBa_2Cu_3O_{7-y}$ Thin Films", Appl. Phys. Lett. 51, 2149 (1987).

R. J. Lin, Y. C. Chen, J. H. Kung, and P. T. Wu, "Preparation of Y-Ba-Cu-O Superconducting Films by Modified DC Sputtering Process", Proc. Mat. Res. Soc. Meeting, Dec. 1987, Boston.

C. Webb, S. L. Weng, J. N. Eckstein, N. Missert, K. Char, D. G. Scholm, E. S. Hellman, M. R. Beasley, A. Kapitulnik, and J. S. Harris, Jr., "Growth of High Tc Superconducting Thin Films Using Molecular Beam Epitaxy Techniques", Appl. Phys. Lett. 51, 1191 (1987).

J. Kwo, T. C. Hsieh, R. M. Fleming, M. Hong, S. H. Liou, B. A. Davidson, and L. C. Feldman, "Structural and Superconducting Properties of Orientation-Ordered $Y_1Ba_2Cu_3O_{7-x}$ Films Prepared by Molecular--Beam Epitaxy", Phys. Rev. B 36, 4039 (1987).

X. D. Wu, A. Inam, T. Venkatesan, C. C. Chang, E. W. Chase, P. Barboux, J. M. Tarascon, and B. Wilkens, "Low-Temperature Preparation of High Tc Superconducting Thin Films", Appl. Phys. Lett. 52, 754 (1988).

A. Gupta, G. Koren, E. A. Giess, N. R. Moore, E. J. M. O'Sullivan, and E. I. Cooper, "$Y_1Ba_2Cu_3O_{7-\delta}$ Thin Films Grown by Simple Spray Deposition Technique", Appl. Phys. Lett. 52, 163 (1988).

M. E. Gross, M. Hong, S. H. Liou, P. K. Gallagher, and J. Kwo, "Versatile New Metalorganic Process for Preparing Superconducting Thin Films", Appl. Phys. Lett. 52, 160 (1988).

S. Pan, K. W. Ng, Al. L. de Lozanne, J. M. Tarascon, and L. H. Greene, "Measurements of the Superconducting Gap of La-Sr-Cu-O with a Scanning-Tunneling Microscope", Phys. Rev. B 35, 7220 (1987).

SILICON

STRONTIUM TITANATE

AS-DEPOSITED OXIDE SUPERCONDUCTOR FILMS ON SILICON AND ALUMINUM OXIDE

Work relating to development of the present invention was supported by AFOSR (87-0228) and NSF (DMR-855305).

BACKGROUND OF THE INVENTION

The present invention relates to the fabrication of conductor thin films which are essential to any practical application of superconductivity to microelectronics. The invention permits the production of superconductor oxide films at temperatures significantly lower than have been possible before.

High temperature superconductors may be especially useful when formed into thin films for use in computers and integrated circuits. There has been some success in this work. Researchers have made very high quality thin films out of not only the Y-Ba-Cu-O compound but also the recently discovered thallium-based superconductors. The problem is that the films had been made under conditions that would not transfer well to semiconductor manufacturing. There have been numerous reports of techniques for growing thin films of the new oxide superconductors. These reports demonstrate not only the tremendous interest and importance of these films, but also the relative ease with which they can be synthesized, as compared with the previous "high-$T_c$" superconductors, namely the A-15's. The new films have been grown by e-beam co-evaporation[1-4] and sequential evaporation,[5] sputtering,[6-9] ion-beam deposition,[10] molecular beam epitaxy,[11-12] laser ablation,[13] spray[14] and spin-on[15] techniques.

To integrate superconducting thin films into existing semiconductor technology, the films need to be placed on silicon—the basic material on which almost the entire semiconductor industry is based. But the techniques for making superconducting films, while successful with specialized base layers or substrates, were unusable in the presence of silicon. The problem was that the temperatures used in the processing were too high. Only one group has reported a deposition temperature of 450° C. with no post anneal[9]. However, the substrates used by this group were immersed in a strong plasma discharge which makes it likely that the substrates were actually at a higher temperature.

The processing techniques for making superconducting thin films vary, but they have certain steps in common. The substrates must be heated and bombarded with atoms or molecules of the materials that will make up the superconducting layer. Then once the thin film condenses onto the substrates, the material generally needs an oxygen treatment at 850° C. or higher to transform it from a non-superconducting form to one that is superconducting. Unfortunately, if this is done on a silicon substrate, the high temperatures in the processing cause the superconductor to react with the silicon molecules, changing the composition of the film to destroy its superconductivity.

The low process temperature is desirable not only to avoid the problems already mentioned by Wu et al.,[13] but also to allow the growth of good films on practical substrates (i.e., other than $SrTiO_3$), or substrates with semiconductor devices. For scientific applications, the capability of using different substrates is important since in many measurements (e.g., optical and radio frequency), the properties of the substrate may obscure those of the film. Most vacuum thin film work to date involves the use of existing vacuum systems with only minor modifications. Large oxygen pressures (up to $10^{-3}$ Torr) have been used in vacuum chambers designed to operate at much lower pressures. The rates become irreproducible with high oxygen pressures because the quartz crystal rate monitors measure the mass deposited on them and therefore the measured rate depends on the degree of oxidation of the metal deposited on the monitor. Rate monitors of other types do not operate at all at such high pressures. Another potential problem due to high pressure is the scattering of the evaporant with the background gas which not only alters the rates but may also produce significant cross talk between different rate monitors. Finally, high pressure can cause e-beam sources to arc or have a severely reduced filament lifetime. The system of the present invention allows the operation of the sources and rate monitors at low pressure while the substrate receives a high flux of oxygen from a plasma source.

Until now, the only good superconducting thin films were made on the substrates such as strontium titanate, that did not react with the superconducting film at such temperatures. The present invention involves a process and apparatus that allow the synthesis of good quality films at temperatures below 550° C. This process yields the highest transition temperatures reported for films on silicon substrates.

SUMMARY OF THE INVENTION

The present invention relates to an apparatus for depositing oxide superconductor films on suitable substrates. The apparatus comprises a first vacuum chamber and a second vacuum chamber. The first vacuum chamber comprises a substrate mount upon which suitable substrates are fixed and rotated, a heating means for heating the substrate mount (and substrate mounted thereon) to a specified temperature, a glass nozzle means for directing plasma-excited oxygen over the surface of a substrate mounted on the substrate mount, and an excitation means coupled to the glass nozzle means for applying radio frequency power to generate plasma within the glass nozzle means. The second vacuum chamber comprises a means for introducing superconductor precursors in their gas states and a means for monitoring the flow of the superconductor precursors. A gas removal pump is connected to each chamber, said pumps operating at differing evacuation rates so that a more substantial vacuum is established in the second chamber, than in the first chamber.

The present invention also relates to a method for depositing oxide superconductor films on substrates. The method comprises an early step of placing a substrate mount in a first vacuum chamber. The substrate is heated, preferably conductively, to a specified temperature, preferably about 550° C. Superconductor precursor components are introduced in their gas states into a second vacuum chamber for dispersal into the first vacuum chamber via an opening between the two chambers. The first and second vacuum chambers are evacuated at different rates, resulting in the first chamber having a higher presure than the second chamber. Plasma-excited oxygen is directed to flow over the mounted substrate as the superconductor precursor molecules are deposited on the substrate. The method of the present invention also describes loading the mounted substrate through a load-lock means, rotating the mounted substrate during the deposition, and controlling the rate of introduction of superconductor precursor components in response to feedback from rate monitors which monitor the rate at which the superconductor precursor components are introduced into the second chamber.

DESCRIPTION OF PREFERRED EMBODIMENT

It is an object of the present invention to deposit oxide superconductor thin films on a suitable substrate at temperatures sufficiently low enough to prevent reaction between the substrate and superconductor film. An advantage of the present invention is the merger of superconductor film technology with silicon substrates as working materials. Thus, superconductor performance advantages are brought into the mainstream of the microelectronics field.

In general, the present invention provides for deposition of oxide superconductor films on suitable substrates. The invention also describes an apparatus for implementing the deposition process. By using a pressure differential to direct plasma-excited oxygen over the surface of a suitable substrate, oxidation of the deposited superconductor molecules can occur at temperatures below 600° C., thereby preventing the superconductor film from reacting with the underlying substrate. In fact, the present invention allows the reproducible growth of oxide superconductor films on substrates at substrate temperatures of 540° C. without destroying the superconductivity of the film and without requiring annealing.

The following is presented to describe the preferred embodiment and utilities of the present invention, and is not meant to limit the present invention unless otherwise stated in the claims appended hereto.

Figure 1:
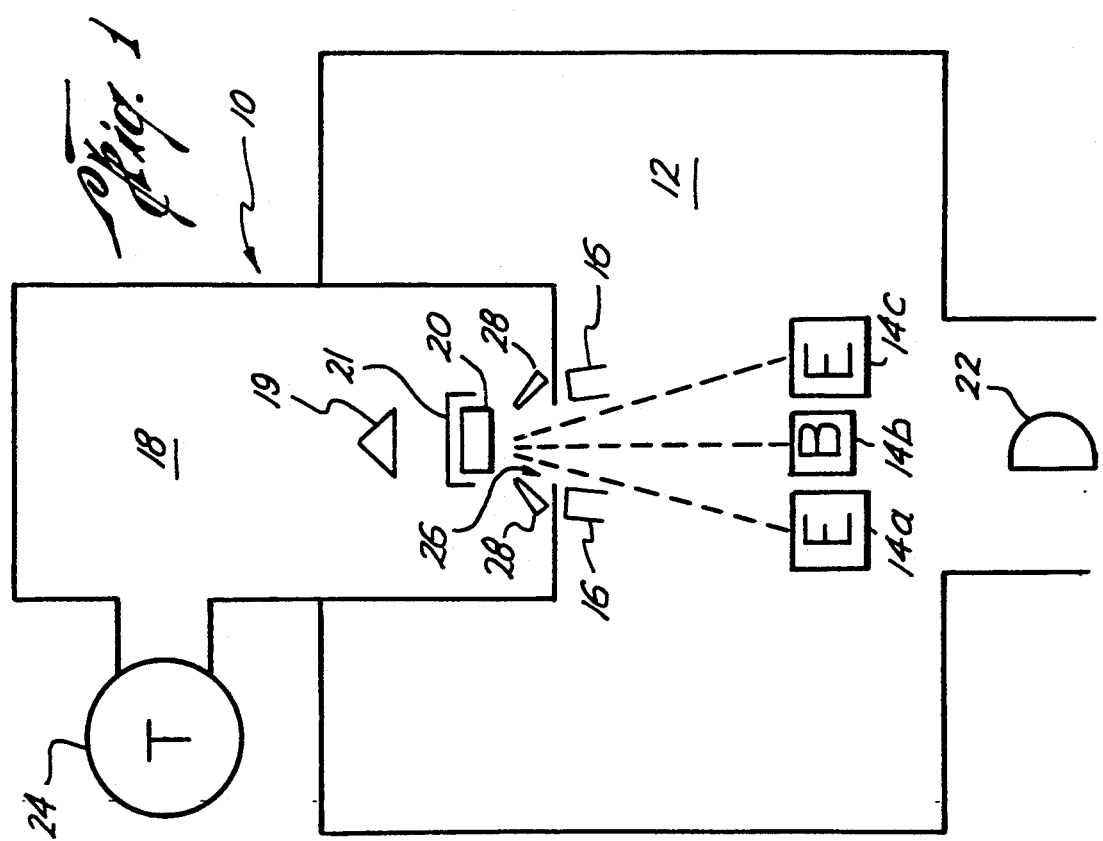
FIG. 1 schematically shows the apparatus 10 for depositing superconductor films of the present invention.

A schematic of the apparatus 10 is shown in FIG. 1. The apparatus 10 is divided into a second chamber 12 that contains the sources 14a, 14b, 14c and quartz crystal rate monitors 16, and a smaller first chamber 18 that houses the heating lamp 19, substrate(s) 20, and substrate mount with rotation means 21. The second chamber 12 is pumped by a large (2700 l/s) diffusion pump 22, yielding a base pressure of $10^{-7}$ Torr, while the substrate chamber 18 is pumped by a 500 l/s turbopump 24. The only connection between the two chambers is a 9 cm diameter hole 26. Oxygen is sprayed on the substrate 20 surface through glass nozzles 28. During deposition the oxygen pressure in the second chamber 12 is $8 \times 10^{-5}$ Torr, while the oxygen pressure in the substrate chamber 18 rises to 3 milliTorr. The oxygen pressure at the substrate 20 surface is estimated to be one order of magnitude higher since oxygen is fed through glass nozzles 28 directed towards the substrate 20. Glass nozzles 28 are used to allow the creation of a plasma inside each nozzle upon application of a radio frequency excitation. In the preferred embodiment, approximately 250 W of radio frequency power (14 MHz) is coupled with a coil wrapped around each nozzle 28.

A preferred embodiment of the present invention uses two electron beam sources, 14a and 14c for yttrium and copper, and a resistively-heated boat 14b for barium. A feedback circuit uses the signals from independent quartz crystal rate monitors 16 to control the rate for yttrium and copper. A third rate monitor 16 displays the barium rate which is manually adjusted for drift. The third rate monitor is not shown in the schematic.

The substrate 20 is held tightly against a copper substrate mount 21 which is heated radiatively with quartz halogen lamps 19 (the substrates are not exposed to the lamps). The temperature of a cavity in the copper substrate mount 21 is measured with a pyrometer which has been calibrated against two thermocouples. This cavity is completely shielded from the radiation coming from the lamps 19, thus avoiding any possible effect on the pyrometer reading. The substrate holder 21 is loaded through a load-lock and is rotated during deposition. The load-lock not only improves the turn-around time but will also allow the measurement of films that have never been exposed to air with a low temperature scanning tunneling microscope[16].

The superconductor oxide films described here were deposited on Si(111) (orientation is not important since the native oxide was not removed), $Al_2O_3$ (1102) (R-plane), and $SrTiO_3$ (100) substrates at a temperature of 540° C. and a rate of 0.6 nm/s for a total thickness of 700 nm. The substrates were rotated at 6 rpm during deposition. After deposition the substrate temperature was lowered to 400° C. for 20 minutes with the plasma spray and rotation still on. The samples were then pulled into the load-lock and allowed to cool in one atmosphere of pure oxygen. The samples were handled in a nitrogen atmosphere as much as possible to prevent damage from moisture[8].

The composition according to wavelength dispersive spectroscopy ("microprobe") is $YBa_{1.72}Cu_{3.16}O_{7-y}$. While this measurement has been calibrated with bulk metal and oxide standards, the measured composition of the thin film has to be corrected due to the fact that part of the signal comes from the substrate. The estimated total uncertainty is about 4 atomic percent. Better films can be grown once the composition can be determined more accurately. The run-to-run reproducibility under the present invention is better than the resolution of energy dispersive spectroscopy (EDS or EDX), and is estimated to be a few percent. With two different runs there is good reproducibility of the superconducting transitions among all samples without much difference due to the type of substrate.

Figure 2:
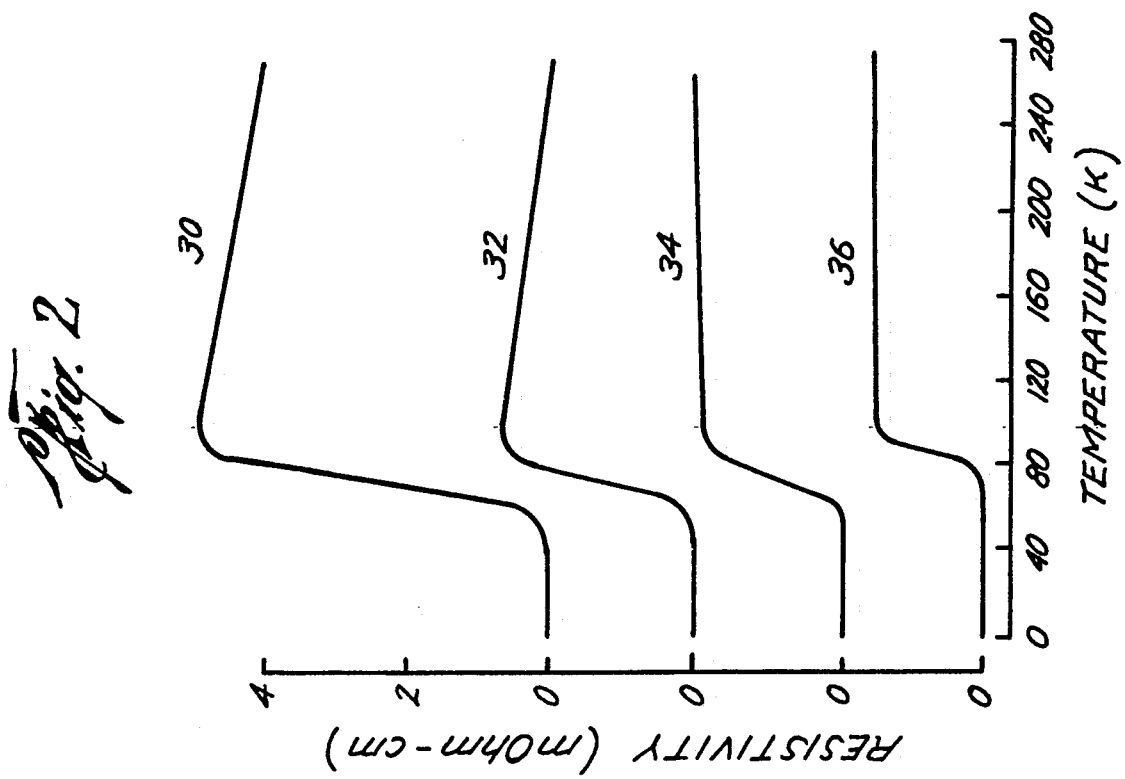
FIG. 2 shows the resistivity as a function of temperature for $YBa_2Cu_3O_{7-y}$ films on various substrates.

The graph in FIG. 2 shows the resistivity versus temperature curves for $YBa_2Cu_3O_{7-y}$ films on silicon 30, sapphire 32 and strontium titana 34, as well as a strontium titanate substrate after annealing at 860° C. for two hours 36.

The resistive transitions of films on $Al_2O_3$, Si, and $SrTiO_3$, shown in FIG. 2, were measured with a 20 microampere (peak-to peak) excitation current and a lock-in amplifier. The resistivity scales were calibrated with van der Paw measurements at 100° K. and 300° K. Contact resistance was always below 200 ohms. The silicon curve 30 in FIG. 2 shows a sharp transition with an onset of 90° K., zero resistance below 68° K., and a width (10%-90%) of 16° K. Although this film was deposited on Silicon, FIG. 2 shows that all three substrates yield very similar resistivity versus temperature curves. The high resistivities above 100° K. are attributed to being off stoichiometry. A preliminary measurement yields critical currents of at least $10^4 A/cm^2$ at 4.2° K. for a film on silicon.

Experiments were performed to determine the effect of annealing at 450° C. and 860° C. Samples on Si, $Al_2O_3$ and $SrTiO_3$ were annealed at 450° C. for 1 hour and then slowly cooled to room temperature. The samples on Si and $Al_2O_3$ showed no change in the resistivity vs. temperature characteristics while the transition width of the $SrTiO_3$ sample was 2 degrees narrower. These measurements indicate that a sufficient amount of oxygen is incorporated into the films during the deposition process. A $SrTiO_3$ sample was annealed at 860° C. for 2 hours and then slowly cooled to room temperature. After annealing, the film showed zero resistivity at 78° K., an improvement of 8° K., and a transition width of 8° K. The fact that the films do not have zero resistivity above 78° K. indicates that they are off stoichiometry. Since the transition was narrower after a high temperature anneal, the as-deposited structure can be improved. Fine-tuning the plasma strength, oxygen pressure, and substrate temperature is likely to improve the structure by increasing the volume of superconducting material.

Figure 3A:
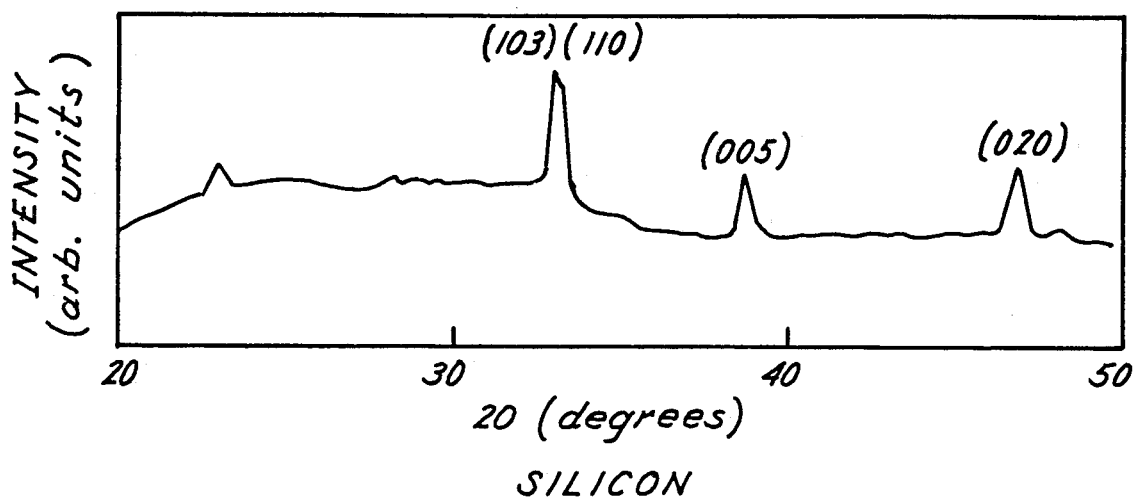
FIG. 3(a) shows an X-ray diffraction pattern of a YBaCuO film on a silicon (111) substrate without post anneal.
Figure 3B:
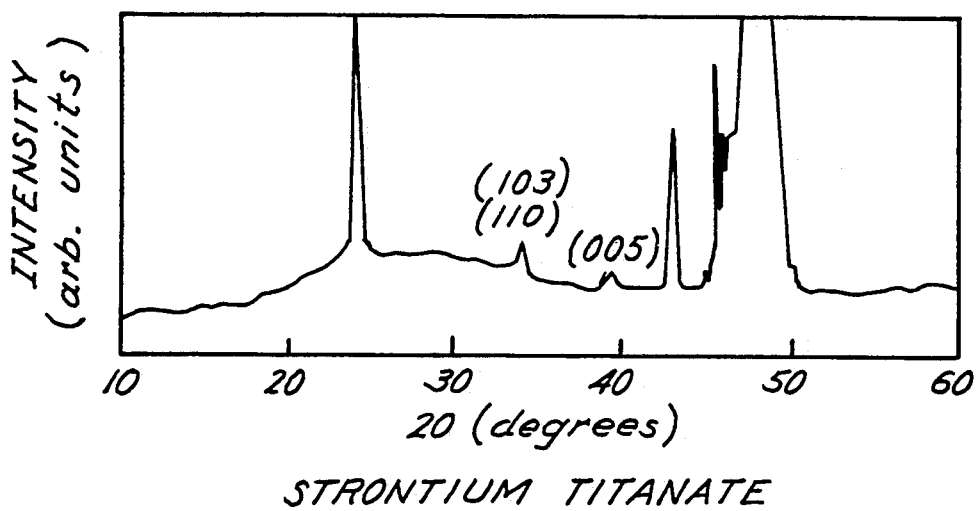
FIG. 3(b) shows an X-ray diffraction pattern of YBaCuO film on a $SrTiO_3$ substrate.

FIGS. 3(a) and 3(b) show X-ray diffraction patterns for samples on Si and $SrTiO_3$ substrates, respectively (same as in FIG. 2). The advantage of using a silicon substrate is that there is no overlap between the (020), (103), (110), and (005) peaks of $YBa_2Cu_3O_{7-y}$ and the substrate peaks. The X-ray pattern in FIG. 3(a) shows the (020) peak at two-theta=46.7°, the (005) peak, and the dominant peak of the polycrystalline orthorhombic phase at two-theta=32.8°. The relative heights of these peaks indicate that this sample shows a preferred orientation with a mixture of b-axis and c-axis growth perpendicular to the substrate. The X-ray pattern in FIG. 3(b) shows that the growth on $SrTiO_3$ was partially oriented in the c-axis direction. X-ray data of depositions on sapphire substrates showed that the growth had no preferred orientation.

In summary, the present invention provides a process (and an apparatus for the implementation thereof) that makes possible the highest superconducting transition temperatures for films deposited on silicon substrates. The properties of these superconductor films are not strongly dependent on the substrates used. The process of the present invention is expected to apply to most of the oxide superconductors, and in particular to the new bismuth- and thallium-based materials[17].

References

Over 100 papers have been published on thin films of the new oxide superconductors. For brevity, reference has been made to only a few representative examples. The following articles are incorporated by reference herein for the reasons stated in the specification.

1. P. Chaudhari, R. H. Koch, R. B. Laibowitz, T. R. McGuire, and R. J. Gambino, Phys. Rev. Lett., 58, 2684 (1987).
2. B. Oh, M. Naito, S. Arnason, P. Rosenthal, R. Barton, M. R. Beasley, T. H. Geballe, R. H. Hammond, and A. Kapitulnik, Appl. Phys. Lett. 51, 852 (1987).
3. D. K. Lathrop, S. E. Russek, and R. A. Buhrmann, Appl. Phys. Lett. 51, 1554 (1987).
4. T. Terashima, K. Iijima, K. Yamamoto, Y. Bando, and H. Mazaki, Jpn. J. Appl. Phys. 27 L91 (1988).
5. B-Y. Tsaur, M. S. DiIorio, and A. J. Strauss, Appl. Phys. Lett. 51, 858 (1987).
6. Y. Enomoto, T. Murakami, M. Suzuki, and K. Moriwaki, Jpn. J. Appl. Phys. 26, L1248 (1987).
7. M. Hong, S. H. Liou, J. Kwo, and B. A. Davison, Appl. Phys. Lett. 51, 694 (1987).
8. R. M. Silver, J. Talvacchio, and A. L. de Lozanne, Appl. Phys. Lett. 51, 2149 (1987).
9. R. J. Lin, Y. C. Chen, J. H. Kung, and P. T. Wu, Proc. Mat. Res. Soc. Meeting, Dec. 1987, Boston.
10. P. Madakson, J. J. Cuomo, D. S. Yee, R. A. Roy, and G. Scilla, to be published in J. Appl. Phys.
11. C. Webb, S. L. Weng, J. N. Eckstein, N. Missert, K. Char, D. G. Scholm, E. S. Hellman, M. R. Beasley, A. Kapitulnik, and J. S. Harris, Jr., Appl. Phys. Lett. 51, 1191 (1987).
12. J. Kwo, T. C. Hsieh, R. M. Fleming, M. Hong, S. H. Liou, B. A. Davidson, and L. C. Feldman, Phys. Rev. B 36, 4039 (1987).
13. X. D. Wu, A. Inam, T. Venkatesan, C. C. Chang, E. W. Chase, P. Barboux, J. M. Tarascon, and B. Wilkens, Appl. Phys. Let. 52, 754 (1988).
14. A. Gupta, G. Koren, E. A. Giess, N. R. Moore, E. J. M. O'Sullivan, and E. I. Cooper, Appl. Phys. Lett. 52, 163 (1988).
15. M. E. Gross, M. Hong, S. H. Liou, P. K. Gallagher, and J. Kwo, Appl. Phys. Lett. 52, 160 (1988).
16. K. W. Ng, A. L. de Lozanne, Proc. 18-th Int. Conf. on Low Temp. Phys., Aug. 22, 1987, Kyoto, Japan. Jpn. J. Appl. Phys, 26 (supplement 26-3) 993 (1987), S. Pan, K. W. Ng, A. L. de Lozanne, J. M. Tarascon, and L. H. Greene, Phys. Rev. B 35, 7220 (1987).
17. C. W. Chu, J. Bechtold, L. Gao, P. H. Hor, Z. J. Huang, R. L. Meng, Y. Y. Sun, Y. Q. Wang, and Y. Y. Xue, Phys. Rev. Lett. 60, 941 (1988).

What is claimed is:

1. A method of preparing an as-deposited oxide superconductor film on a silicon or an aluminum oxide substrate which comprises the steps of:
   (A) emplacing a substrate in a first vacuum chamber so that the substrate faces an opening in the first chamber which connects the first chamber to a second vacuum chamber;
   (B) conductively heating the substrate to a temperature between 500° and 600° C.;
   (C) introducing into the second vacuum chamber metallic superconductor precursor components in their gas states, said components dispersing through the opening into the first vacuum chamber;
   (D) evacuating the first and second vacuum chambers at different rates to establish a greater vacuum in the second vacuum chamber than in the first vacuum chamber by a factor of between one and two orders of magnitude;
   (E) directing a stream of plasma-excited oxygen over the substrate as the superconductor molecules are deposited, said oxygen pressure over the substrate being about one order of magnitude higher than the pressure in the first chamber; and
   (F) allowing sufficient time for the production of the oxide superconductor film without need of post-annealing.

2. The method for depositing an oxide superconductor film of claim 1 in which the introduction step (C) and the evacuation step (D) switch positions in the order of the method claims.

3. The method for depositing an oxide superconductor film of claim 1 or claim 2 in which the introduction into the second chamber of metallic superconductor precursor components comprises the step of directing a beam of electrons at a source material of a metallic superconductor component to evaporate the source material into its gas state.

4. The method for depositing an oxide superconductor film of claim 1 or claim 2 in which the emplacement of the substrate comprises the steps of:
   mounting the substrate on a substrate holder;
   loading the substrate holder into the first chamber through a load-lock means; and
   rotating the mounted substrate during deposition.

5. The method for depositing an oxide superconductor film of claim 1 further comprising the steps of:
   monitoring the rate at which the superconductor precursor components are introduced into the second chamber; and
   controlling the rate of introduction of superconductor precursor components in response to feed back from the rate monitors.

6. The method for depositing an oxide superconductor film of claim 1 or claim 2 in which the oxygen directing step comprises the steps of:
   passing oxygen through a glass nozzle means located in the first vacuum chamber; and
   applying radio frequency power to the glass nozzle means to generate plasma within the nozzles to excite the oxygen as it passes through the nozzle means.

7. The method of claim 1 wherein the pressure of plasma-excited oxygen contacting the substrate is above about 1 m Torr.

8. The method of claim 1 wherein the superconductor molecules comprise yttrium, copper and barium.

9. The method according to claim 1 wherein the substrate is silicon.

10. The method according to claim 1 wherein the substrate is aluminum oxide.

11. The method of claim 9 wherein the silicon substrate is heated to a temperature of 540° C.

12. The method of claim 10 wherein the aluminum oxide substrate is heated to a temperature of 540° C.

* * * * *

UNITED STATES PATENT AND TRADEMARK OFFICE
CERTIFICATE OF CORRECTION

PATENT NO.  : 5,004,721
DATED       : April 2, 1991
INVENTOR(S) : A. L. DeLozanne It is certified that error appears in the above-identified patent and that said Letters Patent is hereby corrected as shown below:

In the title page of the patent, under the heading "[75] Inventor:" delete "A. L. DeLozanne, Austin, Tex." and insert therefore --A. L. de Lozanne, Richard M. Silver, Alan B. Berezin, all of Austin, Tex., and Mark Wendman, Dublin, Cal.--.

In the title page of the patent, under the heading Other Publications, in the first paragraph, on the fourth line, delete the word "Insitu" and substitute therefore --In situ--.

Column 2, line 62, delete word "presure" and substitute therefore --pressure--.

Column 4, line 53, delete word "titana" and therefore --titanate--.

Signed and Sealed this

Thirteenth Day of October, 1992

Attest:

DOUGLAS B. COMER

*Attesting Officer*   *Acting Commissioner of Patents and Trademarks*